United States Patent [19]

Bar-on

[11] Patent Number: 4,695,674
[45] Date of Patent: Sep. 22, 1987

[54] PREFORMED, THIN-FILM FRONT CONTACT CURRENT COLLECTOR GRID FOR PHOTOVOLTAIC CELLS

[75] Inventor: Ari Bar-on, Shaker Heights, Ohio

[73] Assignee: The Standard Oil Company, Cleveland, Ohio

[21] Appl. No.: 771,262

[22] Filed: Aug. 30, 1985

[51] Int. Cl.[4] .................... H01L 31/04; H01L 31/18
[52] U.S. Cl. .................... 136/256; 357/65; 357/71; 427/74; 437/2; 437/181
[58] Field of Search .......... 136/256; 29/572, 589, 29/591; 427/74, 86, 88; 357/65, 71

[56] References Cited

U.S. PATENT DOCUMENTS

| Re. 25,647 | 9/1964 | Mann et al. | 136/244 |
|---|---|---|---|
| 3,442,007 | 5/1969 | Griffin et al. | 228/179 |
| 3,888,697 | 6/1975 | Bogus et al. | 136/260 |
| 4,084,985 | 4/1978 | Evans, Jr. | 136/251 |
| 4,252,573 | 2/1981 | Boer et al. | 136/256 |
| 4,260,429 | 4/1981 | Moyer | 136/256 |
| 4,348,546 | 9/1982 | Little | 136/256 |
| 4,393,576 | 7/1983 | Dahlberg | 29/572 |
| 4,409,605 | 10/1983 | Ovshinsky et al. | 357/2 |
| 4,525,594 | 6/1985 | Pschunder | 136/256 |
| 4,590,327 | 5/1986 | Nath et al. | 136/256 |
| 4,598,306 | 7/1986 | Nath et al. | 357/30 |
| 4,612,410 | 9/1986 | Hewig et al. | 136/256 |

FOREIGN PATENT DOCUMENTS 59-115576 7/1984 Japan .................... 136/244

OTHER PUBLICATIONS

"An Alternative to the 'Five Year Research Plan . . . 1984–1988 . . . Photovoltaics: Electricity from Sunlight'. . . U.S. Department of Energy, May 1983", The Grindelwald Letter, Mar. 1984 edition (eleventh in a series), published by Alfred H. Canada, Mammoth Lakes, Calif.

*Primary Examiner*—Aaron Weisstuch
*Attorney, Agent, or Firm*—Larry W. Evans; Joseph G. Curatolo

[57] ABSTRACT

A photovoltaic cell incorporating a preformed, thin-film front contact current collector grid (14). The cell incorporates an electrically conductive substrate layer (11), a semiconductor body (12) deposited on the substrate layer (11) and a transparent electrically conductive layer (13) deposited on the semiconductor body (12). A collector grid (14) is preformed of a thin-film electrically conductive material which is thereafter electrically communicated with the transparent electrically conductive layer (13) using an electrically conductive adhesive (20).

11 Claims, 5 Drawing Figures

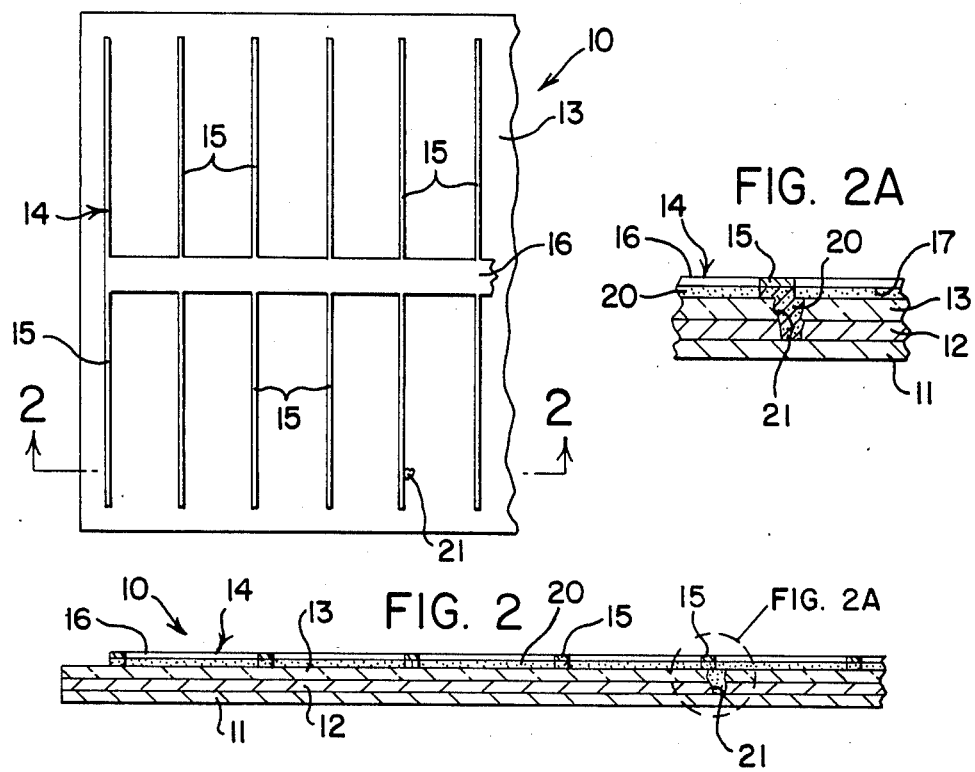
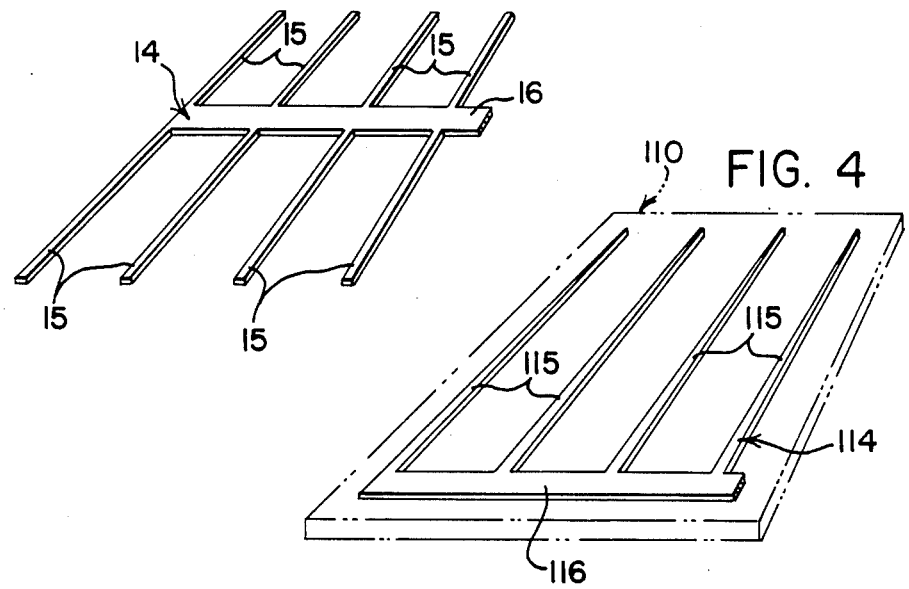

PREFORMED, THIN-FILM FRONT CONTACT CURRENT COLLECTOR GRID FOR PHOTOVOLTAIC CELLS

TECHNICAL FIELD

The present invention relates generally to photovoltaic cells. More particularly, the present invention relates to front contact current collector grids for photovoltaic cells. Specifically, the present invention pertains to a front contact current collector grid preformed from a thin, electrically conductive film.

BACKGROUND ART

Developments made in harnessing solar energy have resulted in three primary types of photovoltaic devices—namely, crystalline solar cells, semi-crystalline solar cells, and amorphous solar cells. Each of these solar cell types produces electricity as a result of what is commonly known in the solar cell field as the photovoltaic effect. This is an inherent feature of a semiconductor region in the photovoltaic device.

In the fabrication of photovoltaic cells, as for example amorphous solar cells, it is necessary to provide means for collecting the current produced from the cell. On the back of the cell, the surface not exposed to solar radiation, an electrically conductive substrate layer, such as stainless steel, is employed to which an electrical connection can be made. On the front surface of the cell, a transparent conductive oxide (TCO) layer and an electrically conductive grid generally are employed which enable electrical current to be collected from the semiconductor region of the cell without unduly obscuring the incidence of solar radiation to the interior of the cell. For a general discussion of the structure and function of amorphous silicon cells and the means of collecting current therefrom, reference may be made to U.S. Pat. No. 4,409,605 to Ovshinsky et al.

Several techniques are presently employed for fabricating the front contact grid of photovoltaic cells. These techniques involve the fabrication of the grid directly onto the transparent conductive layer of the cell. Exemplary of this in situ fabrication of the grids are screen printing with conductive ink, and electroform plating using a mask to form a preselected pattern. These techniques, in addition to being time consuming from a production aspect, present inherent problems in the fabrication of photovoltaic cells. Particularly, the grids thus formed are not readily electrically interconnected when multiple cells are assembled into a photovoltaic array. The small area of the grids, coupled with the material used, for example silver ink for screen printing, precludes favorable soldering or welding of the interconnectors to the grid.

In addition to the foregoing problem, in situ fabrication of grids is more likely to cause shorting of the photovoltaic cell. This occurs because as the semiconductor body and transparent conductive layer are deposited on the substrate, during fabrication of the cell, minute holes, voids or other defects are inevitably formed therein. Though generally not a problem in the operation of the cell, such holes, voids or defects may be filled with the conductive material of the grid at the time the latter is being fabricated on the cell. When this happens, the cell is essentially irrevocably shorted, the transparent conductive layer being shorted to the conductive substrate. Moreover, current generated by other cells in the photovoltaic array is likewise drawn to the short through the grid and interconnects, thereby rendering a considerable area of the array inoperable. Thus, the time, money, and effort expended in fabricating the photovoltaic cell, including deposition of the grid, are lost. These losses result in an increased overall cost in the production of workable photovoltaic cells and arrays.

Efforts have been made to form front contact current collector grids by methods other than in situ fabrication. Exemplary of these efforts is U.S. Pat. No. 4,348,546 to Little wherein a mesh of fine wires is encapsulated between a transparent cover plate and the front surface of the semiconductor strata during fabrication of the solar cell. Use of fine wire as a front contact current collector for solar cells is also discussed in "An Alternative to the 'Five Year Research Plan . . . 1984-1988 . . . Photovoltaics: Electricity from Sunlight'. . . U.S. Department of Energy, May 1983", the Grindewald Letter, March 1984 edition (Eleventh in a series), published by Alfred H. Canada, Mammoth Lakes, Calif.

Despite the substantial work and research conducted in the production of photovoltaic cells and arrays, no practical solutions have been developed to alleviate the aforesaid problems in fabricating the front contact current collector grids.

DISCLOSURE OF THE INVENTION

Therefore, an object of the present invention is a photovoltaic cell having an electrically conductive substrate layer, a semiconductor body deposited on the substrate layer and a transparent electrically conductive layer deposited on the semiconductor body. A preformed thin-film electrically conductive grid is employed having a preselected physical configuration. The preformed grid is electrically communicated with the transparent electrically conductive layer of the photovoltaic cell.

Another object of the present invention is a preformed thin-film front contact current collector grid for a photovoltaic cell. The grid includes a plurality of fingers oriented in a predetermined configuration and a collector bus integrally associated with the fingers. The collector bus and the fingers collectively define the current collecting structure of the grid. The collector bus and the fingers further define a contact surface for electrically communicating with the photovoltaic cell.

A further object of the present invention is a method of disposing a front contact current collector grid on a photovoltaic cell having a transparent conductive layer. The method includes the steps of forming a thin-film conductive material into a predetermined configuration of a grid, and locating the grid relative to the transparent conductive layer of the photovoltaic cell. The grid is communicated electrically with the transparent conductive layer.

Yet a further object of the present invention is a process for fabricating a photovoltaic cell. The process includes depositing a semiconductor body on an electrically conductive substrate layer. A transparent electrically conductive layer is deposited on the semiconductor body. A thin-film conductive material is formed into a predetermined configuration of a grid and located relative to the transparent conductive layer. The grid is communicated electrically with the transparent conductive layer.

Exemplary embodiments of preformed, thin-film electrically conductive grids incorporating the concept of the present invention are shown by way of example in the accompanying drawings without attempting to show all the various forms and modifications in which the invention might be embodied, the invention being measured by the appended claims and not by the details of the specification.

BRIEF DESCRIPTION OF THE DRAWINGS

FIG. 1 is a fragmentary plan view of a photovoltaic cell embodying the concept of the present invention;

FIG. 2 is an enlarged fragmentary cross-section of a photovoltaic cell taken substantially along line 2—2 of FIG. 1;

FIG. 2A is an enlarged cross-sectional inset of the region indicated in FIG. 2;

FIG. 3 is a fragmentary perspective view of a front contact current collector grid embodying the concept of the present invention; and, FIG. 4 is a fragmentary perspective view of an alternative embodiment of a front contact current collector grid according to the present invention.

EXEMPLARY EMBODIMENT FOR CARRYING OUT THE INVENTION

A photovoltaic cell according to the concept of the present invention is indicated generally by the numeral 10 in FIG. 1 of the accomanying drawings. The photovoltaic cell 10 shown is of the general configuration of an amorphous silicon solar cell although the concept of the present invention is equally applicable to all types of solar cells, including crystalline solar cells, polycrystalline solar cells, and amorphous solar cells. As depicted in FIG. 2, the photovoltaic cell 10 includes an electrically conductive continuous substrate layer 11, a semiconductor body 12 deposited on the substrate layer 11, and a transparent electrically conductive layer 13 deposited on the semiconductor body 12.

Elaborating on these elements slightly, the substrate layer 11 preferably is a flexible metallic member, such as stainless steel. The semiconductor body 12 preferably includes an N-type layer, an intrinsic (I-type) layer, and a P-type layer—collectively referred to as a P-I-N type semiconductor—as normally found in solar cells of the amorphous silicon type. The transparent electrically conductive layer 13 is preferably a thin layer of a transparent conductive oxide, such as indium tin oxide (ITO). It should be appreciated that FIG. 2 is not prepared to scale but rather is substantially disproportioned to permit a more detailed representation of the individual elements. As a reference, it should be appreciated that the semiconductor body 12 is typically less than one micron thick; and the substrate layer 11 is generally 200 to 300 microns thick.

Although transparent layer 13 is, itself, electrically conductive, it may be desirable to employ electrically conductive grids 14 to collect efficiently the electrical energy generated over a large area cell, that is, a cell having an active surface area greater than approximately 2 cm$^2$. The grids 14 are preferably formed of a highly conductive material, such as a conductive metal or alloy foil—such as, aluminum, copper, silver, gold, brass, etc. Although the exact configuration of grid 14 may vary to meet the parameters of a specific application, several features are generally common to each as contemplated in the present invention.

Grid 14 is preferably made of thin-film material, as depicted in FIG. 3. Instead, depending upon the specific material employed, the thickness of the film from which grid 14 is made is approximately 1 to 3 mils (0.025 to 0.076 mm). This thin-film material is pre-cut to form a grid 14 of a desired configuration, as by a die cutting process for example, to meet the requirements of the specific photovoltaic cells. Generally, grid 14 has a plurality of narrow fingers 15 integrally associated with, and depending from, a common collector bus 16. The fingers 15 and collector bus 16 collectively define the current collector structure of grid 14, which structure presents a contact surface 17, shown in FIG. 2A, to facilitate electrical communication with transparent conductive layer 13.

Inasmuch as grid 14 is made from opaque material, the surface area of grid 14 must be kept to a minimum so as to reduce losses caused by shadowing of the cell. For the configuration of grid 14 depicted in FIG. 3, each finger 15 preferably has a plan width of approximately 10 mils (0.25 mm), and is spaced approximately 0.2 inch (5.1 mm) from adjacent fingers. Similarly, collector bus 16 preferably has a plan width of approximately 0.1 inch (2.5 mm) or less. Other dimensional parameters, of course, are contemplated. Determinative factors defining the physical parameters of grid 14 include the junction type of the cell—single junction, tandem junction, etc.—the voltage potential of the cell, and the ideal resistance of the grid and the transparent conductive layer.

With grid 14 being fabricated independently of the cell 10, operative association therewith is achieved through the use of a conductive adhesive 20. Specifically, conductive adhesive 20 is preferably a hot-melt type adhesive although other types of adhesive may be employed. Likewise, conductive adhesive 20 preferably possesses an electrical impedance, to the extent of being slightly resistive, for purposes as will be appreciated hereinbelow. Indeed, conductive adhesive 20 having a bulk resistivity of approximately 2 ohms-cm has been found to provide acceptable performance for a cell having a voltage of approximate 1.3 volts, although a broader range of from about 0.5 to 5 ohms-cm is believed to be operable for other voltages which photovoltaic cells are known to operate. At least one suitable conductive adhesive is a carbon loaded, polyimide, hot-melt adhesive.

Conductive adhesive 20 is disposed between grid 14 and transparent conductive layer 13. Conductive adhesive 20 is applied to contact surface 17 of grid 14 at a thickness of approximately 2 mls (0.05 mm). While conductive adhesive 20 can be applied to grid 14 after it has been formed, conductive adhesive 20 likewise can be applied to the thinfilm material prior to the grid 14 being formed therefrom. Thereafter, grid 14 is located on transparent conductive layer 13 and the adhesion therebetween is effected at the temperature and compressive pressure required for the specific adhesive 20 to set, as depicted in FIG. 2.

It should be appreciated that with grid 14 thus affixed to transparent conductive layer 13 with adhesive 20, good electrical communication exists therebetween. Electrical current generated by the photovoltaic cell 10 is, therefore, collected from transparent conductive layer 13 by grid 14 for removal therefrom by suitable interconnections as are commonly employed in photovoltaic arrays and modules. These interconnections would preferably be made to the collector bus 16 of the grid 14.

It should further be appreciated that when grid 14 is formed of a conductive metal or alloy foil, as for example aluminum or nickel foil, interconnections therewith can more readily be effected in a variety of manners. These metals lend themselves more favorably to being soldered or ultrasonically welded than does silver ink. Accordingly, electrical interconnection with grid 14 can be effected using these techinques. Similarly, interconnection can be effected using a conductive adhesive, instead of soldering or welding, when the situation allows, as would be appreciated by one skilled in the art.

The electrical resistance characteristics of the adhesive 20 is appreciated when the grid 14 happens to be located over a minute hole or void 21, or other defect, in transparent conductive layer 13 and semiconductor body 12, as depicted in FIG. 2A. Upon installation of grid 14, adhesive 20 will tend to flow into and fill hole 21. Although an electrically conductive path may now exist between grid 14 and substrate layer 11, the electrical resistance of adhesive 20 will be substantially greater then that of grid 14. Therefore, current absorbed by grid 14 from the remainder of the photovoltaic cell 10 will follow along the path of least resistance, i.e., grid finger 15 and collector bus 16, rather than shorting with substrate layer 11. Similarly, current from other cells in an array will not flow to the affected cell and short. It should be appreciated that grid 14 and adhesive 20 enable the photovoltaic cell 10, and an array into which they are incorporated, to remain operable under conditions which would otherwise have resulted in a dead short under prior art fabrication practices.

With the structure of grid 14 thus described, a method of incorporating the same into a photovoltaic cell 10 having a transparent conductive layer 13 can be appreciated. Specifically, a thin-film conductive material, such as an aluminum foil, is formed into a predetermined configuration of a grid 14. This is preferably accomplished with a die cutting process wherein the configuration of grid 14 is cut from the thin-film conductive material.

Contact surface 17 of grid 14 is coated with a layer of conductive adhesive 20 and, preferably being a hot-melt type adhesive, is permitted to partially cure. Thereafter, grid 14 is located on transparent conductive layer 13 of the photovoltaic cell 10 in a predetermined position. Suitable pressure and temperature are applied to complete the curing process of adhesive 20 and thereby securely bond grid 14 to transparent conductive layer 13. The cell 10 is then tested by exposure to a radiant light source to assure correct operation of the cell 10 and particularly the collection of electrical current by grid 14.

It should be appreciated that the foregoing method of fabrication can be achieved as a piecemeal operation. However, it should also be recognized that the aforesaid method can be effected in a continuous operation. Indeed, continuous grids 14 can be cut from continuous strips of thin-film conductive material and serially bonded to continuous photovoltaic cell strips. Such an operation would greatly expedite the fabrication and production of photovoltaic cells and ultimately reduce the overall cost thereof.

The foregoing advantages and characteristics of a photovoltaic cell 10 of the foregoing embodiment are likewise associated with a photovoltaic cell 110 incorporating other grid configurations as, for example, the alternative grid 114 depicted in FIG. 4. Again, grid 114 is fabricated of highly conductive thin-film material, such as a conductive metal foil as discussed above with respect to grid 14. This thin-film material is pre-cut to form grid 114.

Grid 114 differs primarily from grid 14 in its configuration. Specifically, the fingers 115 are triangular in shape with the plan width thereof continually decreasing toward the tip thereof. Fingers 115 are integrally associated with, and depend in one direction from, collector bus 116.

The configuration of grid 114 provides several significant advantages. Collector bus 116 is capable of being located proximate to an edge of a photovoltaic cell thereby permitting interconnection to be made without shadowing the photovoltaic cell. Furthermore, the tapered configuration of fingers 115 permits uniform current density to exist throughout fingers 115. As the current flows toward collector bus 116 the accumulation of current from the cell will necessitate a larger conductor path than is required at the most distal end of finger 115. Accordingly, the tapered configuration of fingers 115 provides ample current carrying capacity throughout their length while providing minimal surface area so as to reduce losses due to shadowing of the cell.

It should be appreciated that grid 114 is incorporated into a photovoltaic cell in the same manner as grid 14. Namely, grid 114, being preformed from thin-film material, is affixed to the transparent conductive layer of a cell by employing a conductive adhesive, as discussed above. This embodiment will provide the same desirable characteristics and advantages as are attributable to the embodiment incorporating grid 14.

It should also be appreciated, therefore, that the foregoing advantages and characteristics are likewise associated with grids of other configurations. Indeed, the configuration of a grid will depend primarily on the specific photovoltaic cell into which it will be incorporated. The concept of employing a grid preformed of a thin-film conductive material which is thereafter secured to the cell using a conductive adhesive is equally applicable to other grid configurations. As such, the foregoing invention should be recognized as constituting a novel and advantageous contribution to the art of fabricating photovoltaic cells.

I claim:
1. A photovoltaic cell comprising:
an electrically conductive substrate layer;
a semiconductor body deposited on said substrate layer;
a transparent electrically conductive layer deposited on said semiconductor body;
preformed thin-film electrically conductive grid means for collecting electrical current from said cell, said grid means having a predetermined physical configuration; and
an electrically conductive adhesive on said grid means to physically and electrically connect said grid means to said transparent electrically conductive layer, said adhesive having a bulk resistive of from about 0.5 ohms-cm to about 5 ohms-cm.

2. The photovoltaic cell according to claim 1 wherein said adhesive possesses a bulk resistivity of approximately 2 ohms-cm.

3. The photovoltaic cell according to claim 2, wherein said grid means comprises a plurality of finger means integrally associated with a collector bus means.

4. The photovoltaic cell according to claim 3, wherein said grid means is a metal foil.

5. A method of disposing a front contact current collector grid on a photovoltaic cell having a transparent conductive layer comprising the steps of:
   forming a thin-film conductive material into a predetermined configuration of a grid;
   coating one surface of said grid with an electrically conductive adhesive having a bulk resistivity from about 0.5 ohms-cm to about 5 ohms-cm;
   locating said grid relative to the transparent conductive layer of the photovoltaic cell; and
   bonding said grid to the transparent conductive layer with said electrically conductive adhesive.

6. The method of disposing a front contact current collector grid on a photovoltaic cell according to claim 5, wherein said step of forming is a die cutting process.

7. The method of disposing a front contact current collector grid on a photovoltaic cell according to claim 5, wherein said electrically conductive adhesive is applied to said grid prior to locating said grid on the transparent electrically conductive layer of the photovoltaic cell.

8. The method of disposing a front contact current collector grid on a photovoltaic cell according to claim 5, wherein said adhesive possesses a bulk resistivity of approximately 2 ohms-cm.

9. A process for fabricating a photovoltaic cell comprising:
   depositing a semiconductor body on an electrically conductive substrate layer;
   depositing a transparent electrically conductive layer on said semiconductor body;
   forming a thin-film conductive material into a predetermined configuration of a grid;
   coating one surface of said grid with an electrically conductive adhesive having a bulk resistivity from about 0.5 ohms-cm to about 5 ohms-cm;
   locating said grid relative to said transparent conductive layer; and
   bonding said grid to said transparent conductive layer with said electrically conductive adhesive.

10. The process for fabricating a photovoltaic cell according to claim 9, wherein said grid has a plurality of finger means integrally associated with a collector bus means.

11. The process for fabricating a photovoltaic cell according to claim 10, wherein said electrically conductive adhesive impedes flow of electrical current from said grid to defects in the photovoltaic cell when said grid is bonded thereto.

* * * * *